(12) United States Patent
Avss et al.

(10) Patent No.: US 7,623,367 B2
(45) Date of Patent: Nov. 24, 2009

(54) READ-ONLY MEMORY DEVICE AND RELATED METHOD OF DESIGN

(75) Inventors: Prasad Avss, Bangalore (IN); Ravi Pathakota, Proddatur (IN)

(73) Assignee: Agere Systems Inc., Allentown, PA (US)

( * ) Notice: Subject to any disclaimer, the term of this patent is extended or adjusted under 35 U.S.C. 154(b) by 509 days.

(21) Appl. No.: 11/580,786

(22) Filed: Oct. 13, 2006

(65) Prior Publication Data

US 2008/0104549 A1   May 1, 2008

(51) Int. Cl.
*G11C 17/00* (2006.01)
(52) U.S. Cl. ..................................... 365/94; 365/104
(58) Field of Classification Search ............ 365/94–104
See application file for complete search history.

(56) References Cited

U.S. PATENT DOCUMENTS

| | | | |
|---|---|---|---|
| 4,144,561 A | 3/1979 | Tu et al. | |
| 4,240,151 A | 12/1980 | Kawagoe | |
| 4,242,752 A | 12/1980 | Herkert | |
| 4,389,705 A | 6/1983 | Sheppard | |
| 4,402,043 A | 8/1983 | Guttag et al. | |
| 4,419,741 A | 12/1983 | Stewart et al. | |
| 4,571,708 A | 2/1986 | Davis | |
| 4,716,547 A | 12/1987 | Baskett et al. | |
| 4,831,522 A | 5/1989 | Henderson et al. | |
| 4,888,735 A | 12/1989 | Lee et al. | |
| 5,012,451 A | 4/1991 | An et al. | |
| 5,047,825 A | 9/1991 | Yasaka et al. | |
| 5,151,876 A | 9/1992 | Ikeda | |
| 5,204,842 A | 4/1993 | Umeki | |
| 5,231,603 A | 7/1993 | Luhramann | |
| 5,337,278 A | 8/1994 | Cho | |
| 5,347,493 A | 9/1994 | Pascucci | |
| 5,373,480 A | 12/1994 | Kudou | |
| 5,420,818 A | 5/1995 | Svejda et al. | |
| 5,477,490 A | 12/1995 | Miyawaki et al. | |
| 5,528,534 A | 6/1996 | Shoji | |
| 5,598,365 A | 1/1997 | Shoji | |
| 5,740,108 A * | 4/1998 | Okubo | 365/185.17 |
| 5,768,584 A | 6/1998 | MacDonald et al. | |
| 5,787,033 A * | 7/1998 | Maeno | 365/182 |
| 5,880,999 A | 3/1999 | Ansel et al. | |
| 5,907,515 A | 5/1999 | Hatakeyama | |
| 6,018,487 A | 1/2000 | Lee et al. | |
| 6,198,678 B1 | 3/2001 | Albon et al. | |
| 6,221,722 B1 | 4/2001 | Lee | |
| 6,282,136 B1 * | 8/2001 | Sakurai et al. | 365/203 |

(Continued)

*Primary Examiner*—Stacy A Whitmore

(57) ABSTRACT

A ROM comprises several bit output lines and X address decode lines, and stores a data set. Each address decode line stores a unique data word. Addresses in the data set that have the same data word are mapped by the decoder to the same address decode line. Each address decode line is electrically connected to a bit output line as determined by the data set. An initial design of the ROM uses N connecting devices to respectively electrically connect N of the address decode lines to a bit output line. If N exceeds X/2, then an optimization process is performed. The optimization process involves electrically disconnecting each address decode line that was connected to the bit output line, and electrically connecting each address decode line that was not connected to the bit output line. The output of the bit output line is then run through a logical inverter to provide the correct output data bit.

3 Claims, 7 Drawing Sheets

U.S. PATENT DOCUMENTS

| | | |
|---|---|---|
| 6,347,064 B1 | 2/2002 | Seo |
| 6,396,767 B1 | 5/2002 | Tzeng et al. |
| 6,429,494 B1 | 8/2002 | Zimmermann |
| 6,525,954 B2 | 2/2003 | Becker |
| 6,587,364 B1 * | 7/2003 | Kablanian et al. ............. 365/63 |
| 6,687,782 B1 * | 2/2004 | Normile ........................ 711/2 |
| 7,035,129 B1 | 4/2006 | Khanuja |
| 7,075,826 B2 | 7/2006 | Lee et al. |
| 7,158,439 B2 * | 1/2007 | Shionoiri et al. ........ 365/230.06 |
| 7,218,544 B2 * | 5/2007 | Yamauchi ................... 365/104 |
| 7,290,118 B2 * | 10/2007 | Smith et al. .................. 711/219 |
| 7,352,604 B2 * | 4/2008 | Shionoiri et al. .............. 365/94 |
| 2004/0179384 A1 * | 9/2004 | Miwa et al. ................. 365/100 |
| 2005/0047266 A1 * | 3/2005 | Shionoiri et al. ............ 365/233 |
| 2007/0195574 A1 * | 8/2007 | Mabuchi ...................... 365/94 |
| 2008/0056043 A1 * | 3/2008 | Jahnke et al. ............... 365/222 |

* cited by examiner

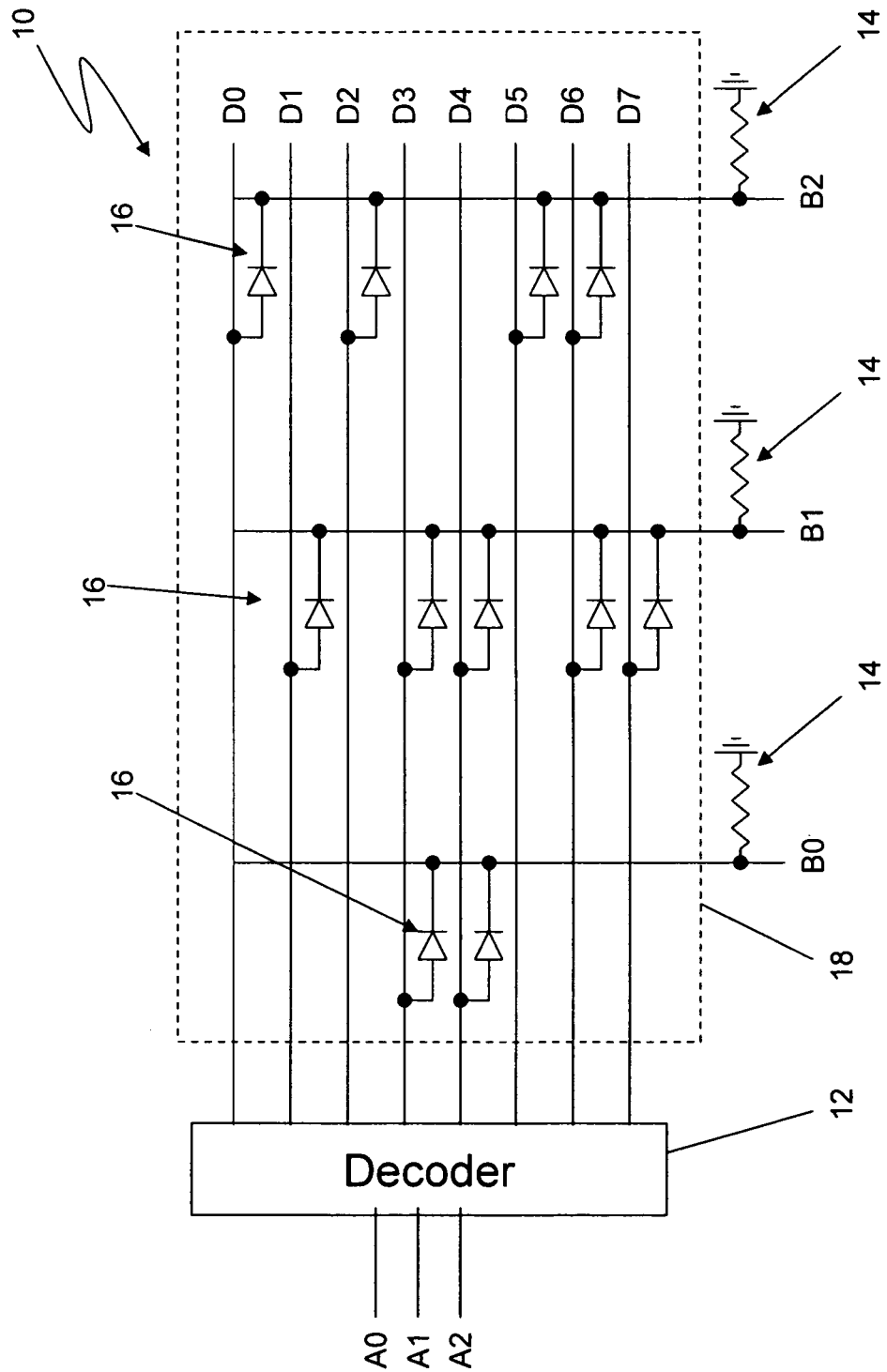
Fig. 1A, Prior art

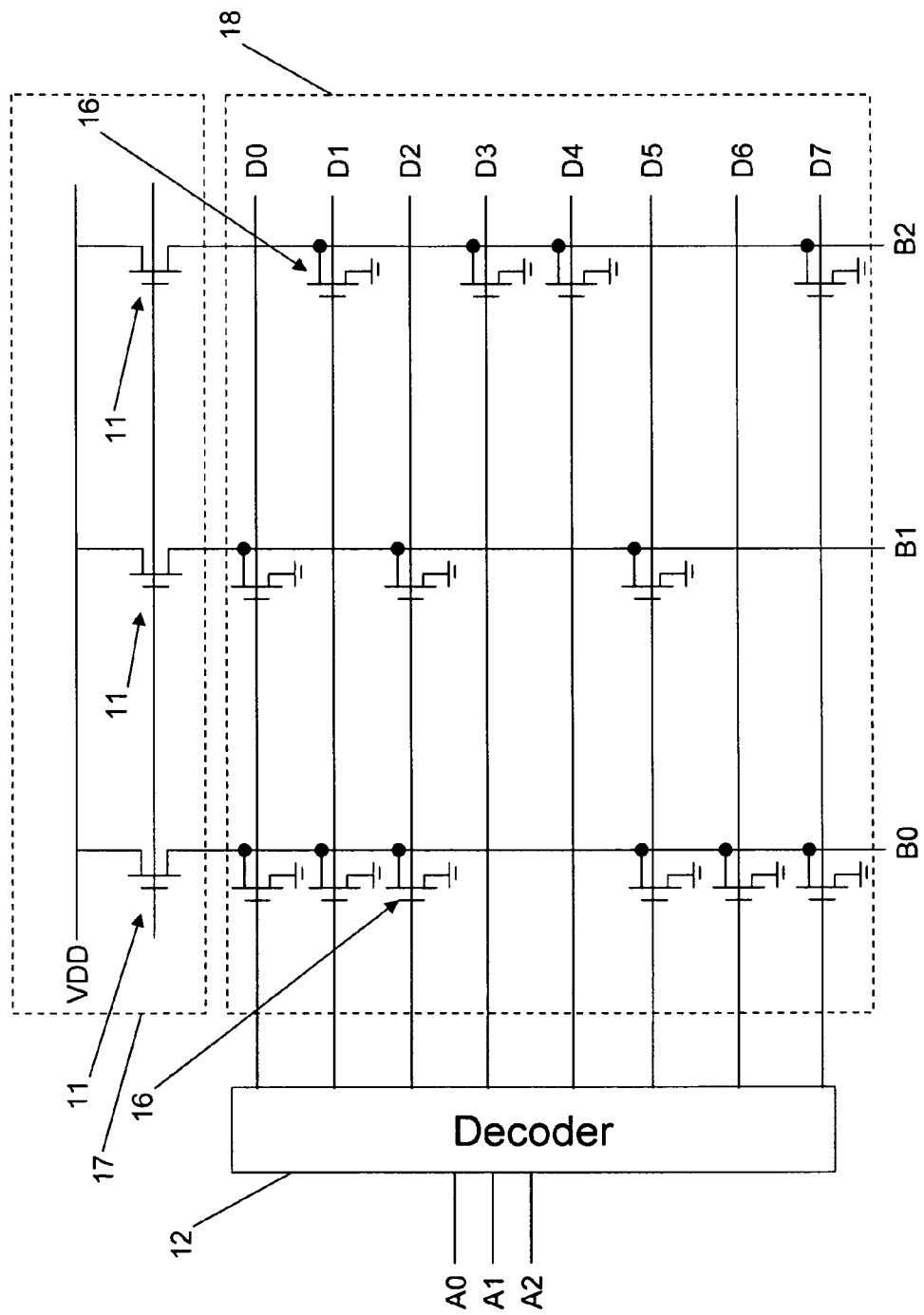
Fig. 1B, Prior art

READ-ONLY MEMORY DEVICE AND RELATED METHOD OF DESIGN

FIELD OF THE INVENTION

The present invention relates generally to the design of an integrated circuit chip by reducing the size requirements of the ROM, and more particularly, to restructuring the architecture of the ROM based upon the data to be stored within the ROM, which may be applicable to SoC and ASIC devices.

BACKGROUND OF THE INVENTION

Steady advances in miniaturization techniques for integrated circuits have resulted in circuit devices, particularly transistors, of ever-diminishing sizes. Generally speaking, each generation of an integrated circuit utilizes transistors that occupy smaller footprints on the semiconductor substrate than those of the previous generation. However, consumer desires, with resultant design demands, seem to grow even faster than integrated circuit devices have been shrinking. As a result, rather than being in surplus, substrate real estate remains at a premium. Every unit area of a substrate must be maximally utilized to squeeze as much performance as possible into the limited space of the circuit die. If a way can be found to reduce the size of a circuit in one portion of a chip, the area thereby freed up can be used to support additional circuitry to pack even more logic functionality into the same die. The miniaturization race therefore involves not only reducing the footprint of individual devices, such as transistors, on the die, but also finding ways to use fewer such devices to achieve the same functionality.

Many digital designs employ read-only memory (ROM), which is built directly onto the same die with the rest of the circuit. This on-chip ROM provides necessary data for the circuit, such as microcode instructions, object code, operating parameters and the like. Generally, read-only memory (ROM) has N address lines as input for accessing $2^N$ data words respectively stored within the ROM at $2^N$ addresses, where $N \geq 2$. Each data word may hold M data bits, $M \geq 1$, which are provided on M respective bit output lines. Hence, at a high level of abstraction, a ROM stores a data set and implements a $2^N \times M$ look-up table with this data set, in which the input value is provided on the N address lines, and the output result is provided on the M bit output lines. By way of example, the following $2^3 \times 3$ data set is considered:

TABLE 1

| Address (A2, A1, A0) | Data word B0 | B1 | B2 |
|---|---|---|---|
| 0 (0, 0, 0) | 0 | 0 | 1 |
| 1 (0, 0, 1) | 0 | 1 | 0 |
| 2 (0, 1, 0) | 0 | 0 | 1 |
| 3 (0, 1, 1) | 1 | 1 | 0 |
| 4 (1, 0, 0) | 1 | 1 | 0 |
| 5 (1, 0, 1) | 0 | 0 | 1 |
| 6 (1, 1, 0) | 0 | 1 | 1 |
| 7 (1, 1, 1) | 0 | 1 | 0 |

Three address input bits, A0, A1 and A2, provide eight addresses, 0 to 7, each of which stores a data word of three bits, B0, B1 and B2. Although specific reference in the following is drawn to an 8×3 data set, the principles are applicable to any generalized $2^N \times M$ data set, as is known in the art, where N is the number of address bits, and M is the number of bits in the data word.

A prior art design for a ROM 10 that implements the data set of Table 1 is shown in FIG. 1A. The prior art design 10 comprises three bit output lines B0, B1 and B2, and eight address decode lines D0 to D7 connected to an address decoder 12. The address decode lines D0-D7 are normally low. The decoder 12 is an N to $2^N$ decoder. In the specific example, the decoder 12 accepts as input three address lines A0, A1 and A2, and based upon this input selects, or asserts, one of the $2^3$ address decode lines D0-D7. Since the ROM 10 uses true logic, when an address decode line D0-D7 is asserted, that address decode line D0-D7 goes high. The decoder 12 creates a one-to-one correspondence between input values provided by address lines A0-A2 and selected address decode lines D0-D7, wherein when an address "x" is placed upon address lines A0-A2, the decoder 12 asserts, or raises, address decode line Dx. For example, if the address inputs (A2, A1, A0) are (0, 0, 0), then the decoder 12 will assert address decode line D0; all other address decode lines D1-D7 are not asserted, and so remain low. Similarly, if the address inputs (A2, A1, A0) are (1, 1, 1), then the decoder 12 will assert address decode line D7, and all other address decode lines D0-D6 are not asserted. In the following, it is assumed that A2 is the high order address bit, and that A0 is the low order address bit.

Each bit output line B0-B2 is tied to ground via a pull-down resistor 14, and is therefore normally in a logical zero state. By utilizing any suitable connecting device 16 to selectively electrically connect each bit output line B0-B2 to zero or more address decode lines D0-D7, it is possible to implement the data set of Table 1. By electrically connecting a bit output line B0-B2 to an address decode line D0-D7, the normally-low bit output line B0-B2 will go high when the address decode line D0-D7 is asserted. Each connecting device 16 may therefore represent a logical one for the corresponding output bit B0-B2 at a corresponding value of the input address provided by address lines A0-A2.

For the sake of simplicity, the connecting device 16 of FIG. 1A is shown as a diode 16. One of skill in the art will readily recognize that this diode 16 may, in fact, be implemented by a transistor. Hence, one way to implement the logic array 18 is by using MOS transistors 16 for the connecting devices, rather than diodes. It should be noted that when diodes are used as connecting devices, a diode is typically electrically connected when the associated bit is supposed to be '1', whereas if a MOS transistor is used as the connecting device then the transistor is typically connected for all those bits where the output is supposed to be '0'. But for this difference, the remainder of the logic and following discussion hold for both diode and transistor based configurations.

By way of an example that utilizes a transistor-based configuration, reference is further drawn to FIG. 1B. The top three transistors 11 in FIG. 1B act as pre-charge transistors 11. Before reading from a location in the ROM 10, all the bit output lines B0, B1, B2 are pre-charged using the pre-charge logic 17. Depending on the decoder 12 output, the specific output bit lines B0, B1, B2 will be discharged. Of course, any suitable component known in the art may be used for the connecting devices 16.

For example, as shown in FIGS. 1A and 1B, when the input address (A2, A1, A0) is (0, 0, 0), the output data word (B0, B1, B2) provided by bit output lines B0-B2 is (0, 0, 1). In FIG. 1A, bit output line B2 is electrically connected to address decode line D0 with a connecting device 16, while bit output lines B0 and B1 are not connected to address decode line D0; the reverse is true in FIG. 1B, so as to provide the same logical output. Similarly, based on Table 1, an output data word (B0, B1, B2) of (1, 1, 0) is desired when the input address (A2, A1, A0) is (0, 1, 1) or (1, 0, 0). The address (0, 1, 1) selects address decode line D3; address (1, 0, 0) selects address decode line D4. As a result, bit output lines B0 and B1 are both electrically connected to address decode lines D3 and D4 in FIG. 1A, using four respective connecting devices 16. On the other hand, in FIG. 1B, these bit output lines are not connected, and instead bit output line B2 is connected to address decode lines D3 and D4. The entirety of the data set provided by Table 1 may in this manner be encoded into the initial ROM design 10 with the logic array 18, wherein each address decode line D0-D7 stores, or encodes, the corresponding data word for that address.

One of reasonable skill in the art will readily note that the ROM 10 can also be configured as a 2-D structure, with both column and row decoders. Such a 2-D structure is simply a slightly more complex generalization of the structure shown in FIGS. 1A and 1B, and is known in the art.

Because ROM is such a ubiquitous component, it would be highly beneficial if a method could be found to reduce the footprint of the ROM, and thereby free up substrate real estate for other circuit components. In particular, since the logic array 18 that encodes the data set occupies a relatively large footprint, it would be particularly beneficial if the size of the logic array 18 could be reduced.

SUMMARY OF THE INVENTION

In one aspect, a ROM comprises bit output lines and X address decode lines. Each address decode line may be electrically connected to a bit output line by a connecting device, such as a diode or a transistor, according to a data set that is to be stored by the ROM. An initial design of the ROM uses N connecting devices to respectively electrically connect N of the address decode lines to a bit output line. If N exceeds X/2, then an improvement process is performed. The improvement process involves inverting the electrical connections between the bit output line and the address decode lines by electrically disconnecting each address decode line that was connected to the bit output line, and electrically connecting each address decode line that was not connected to the bit output line. This, in effect, logically inverts the data encoded by the connections to the bit output line. The output of the bit output line is then run through a logical inverter to provide the correct output data bit.

In another aspect of the invention, addresses in the data set that hold the same data word value are identified. A ROM is then provided that has at least as many address decode lines as there are unique data words in the data set. An address line decoder is provided that maps the addresses to the address decode lines so that each address that has the same data word value is mapped to the same address decode line. This can be extended very easily to 2-D structures.

BRIEF DESCRIPTION OF THE DRAWINGS

FIGS. 1A and 1B are circuit diagrams of a prior art ROM design.

DETAILED DESCRIPTION

Figure 2:
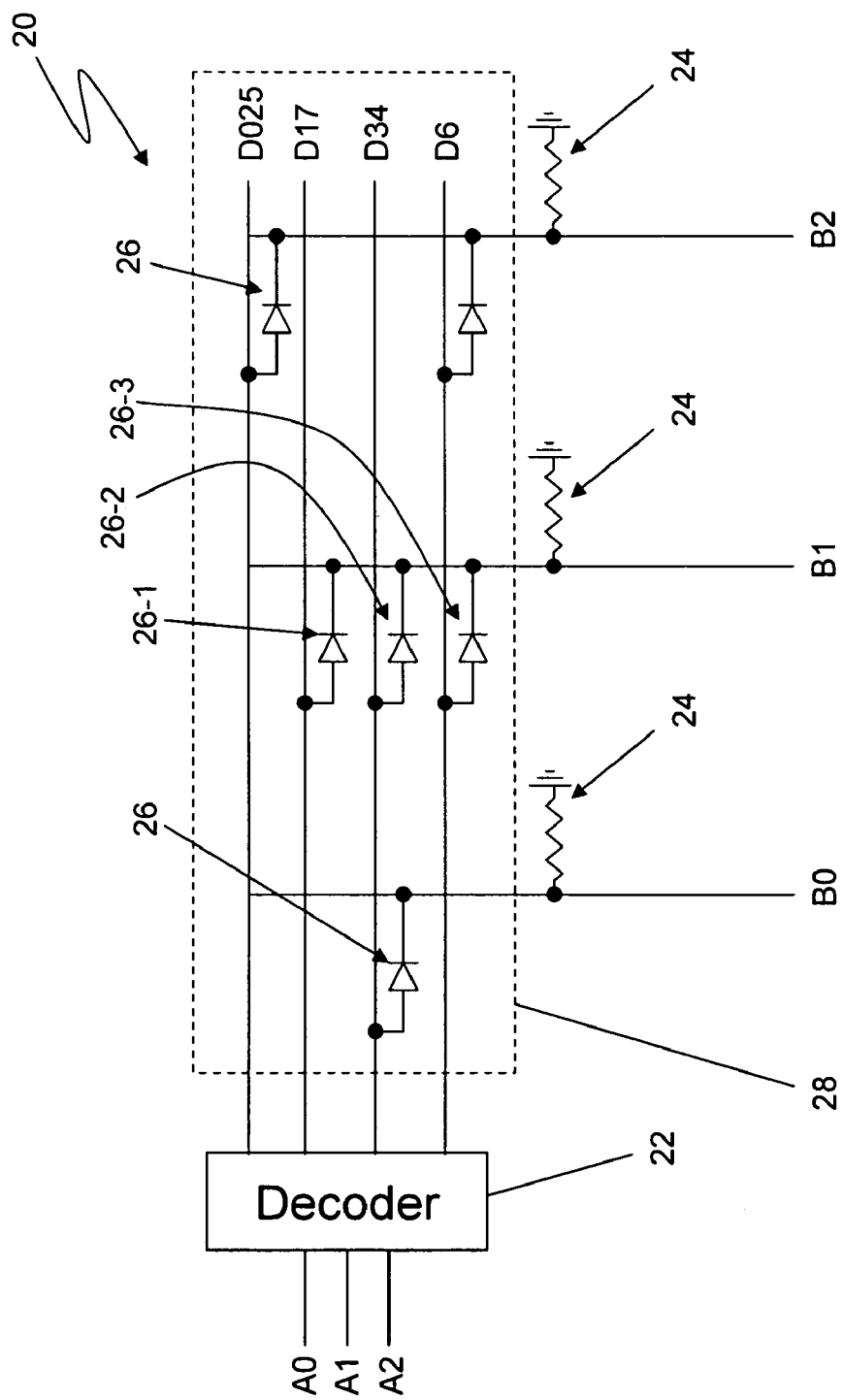
FIG. 2 is a circuit diagram of a first embodiment improved ROM.

For purposes of the following description, when a line is "asserted," a line is driven into a particular logical state to indicate the occurrence of a certain event or value, or to cause a certain event or value to occur. A line may be asserted high (true logic) or low (false logic). As with the design of most digital logic components, the type of logic used, true or false, is purely a design choice. Hence, in the following, if true logic is used by way of example, it should be clear that with minor modifications false logic could equivalently be used. Such permutations of logic are common for those having ordinary skill in the art of digital electronics.

The term "map" is broadly meant as an operation which converts a value to another value, such as y=f(x). The mapping function f(x) may map a set of numbers into a larger space, an equally-sized space, or a smaller space. With respect to a digital component, a digital component may map a value provided on an input into another value provided on one or more outputs. With particular respect to a decoder, a decoder accepts as input an N-bit value, and maps that N-bit value by asserting one of X output lines, as known in the art. A decoder may thus be used to map an input value to an output value or line.

Additionally, for purposes of the following, when an address decode line is said to "store" or "encode" a data word, it is to be understood that such "storing" or "encoding" may be manifested by the electrical connections established between the address decode line and one or more bit output lines.

The instant invention methods, and related ROM designs, seek to improve the layout of a ROM by first analyzing the data set that the ROM is to store, and then tailoring the design of the ROM to the data set so as to reduce the number of devices in the ROM. By way of continuing example, reference is again drawn to the data set of Table 1. A first aspect of the invention begins by noting identical data words in the data set. If two or more addresses contain the same data word, then the redundant rows in the table corresponding to these entries may be removed, and the addresses of these removed entries are consolidated with the address of the single entry that is not removed. This is termed row collapsing the table. For example, in Table 1, addresses zero, two and five all have the same data word, (B0, B1, B2)=(0, 0, 1). The rows for any two of these three entries may be considered redundant, such as the entries for addresses two and five. The rows for addresses two and five may thus be row collapsed. The redundant entries for addresses two and five are removed from the table, and the addresses two and five are consolidated with the address of the remaining entry, address zero. Hence, a single row will exist in the newly row collapsed table, in which the data word is (B0, B1, B2)=(0, 0, 1), and the corresponding address contains not one but three addresses: zero, two and five.

With respect to Table 1, a similar procedure may be performed for the rows containing addresses one and seven, in which the data word (B0, B1, B2)=(0, 1, 0); and the rows for addresses three and four, in which the data word (B0, B1, B2)=(1, 1, 0). The result, when all redundant entries have been removed, is a fully row collapsed table that contains no rows that have identical data word entries. With respect to Table 1, the fully row collapsed table is presented below:

TABLE 2

| Address | Data word | | |
|---|---|---|---|
| | B0 | B1 | B2 |
| 0, 2, 5 | 0 | 0 | 1 |
| 1, 7 | 0 | 1 | 0 |
| 3, 4 | 1 | 1 | 0 |
| 6 | 0 | 1 | 1 |

As can be seen from Table 2 above, half of the rows in Table 1 have been collapsed, yielding Table 2 with but four rows. Each row of Table 2 holds a unique data word (B0, B1, B2). The embodiment invention method proceeds by designing an improved ROM based upon the row-collapsed table, which, like Table 2 above, may ideally have no repetitive data word entries. That is, it is not necessary that all redundant rows be collapsed, but it may be desirable to do so. The improved ROM has a structure similar to the prior art ROM design 10, but has a modified decoder, and a reduced number of address decode lines. In particular, the improved ROM may have as many address decode lines as there are rows in the row collapsed table; the row collapsed table may have only unique data word entries (if it is fully row collapsed), or may have one or more redundant data word entries. In a specific embodiment, the data set is fully row-collapsed, so that each address decode line stores a unique data word value that no other address decode line in the ROM stores. Because there may be more input addresses than address decode lines, the modified decoder may cause at least two input addresses to map to the same address decode line. That is, in certain embodiments the modified decoder may be an N to X decoder, where X is greater than one and less than $2^N$, and each of $2^N$ possible input address values maps to one and only one of the X output address decode lines. The mapping function may be constructed so that an address decode line stores the data word for the address value mapped to that address decode line.

A first embodiment improved ROM 20 is depicted in FIG. 2, which implements the data set as presented in Table 1, but uses the fully row-collapsed version of the data set, as presented by Table 2, to yield an improved ROM design. Although in the following, implementations that use fully row collapsed tables are indicated, it should be clear that implementations that use partially row collapsed tables are also possible; that is, improved ROM designs based on data set tables in which some, but not all, redundant entries have been row collapsed are also possible. Additionally, the use of positive logic in the form of diodes is shown; it should be clear that negative logic, as provided by transistors, could also be used.

The logic array 28 of the improved ROM 20 comprises four address decode lines D025, D17, D34 and D6 as output from a decoder 22; three address lines A0-A2 for input into the decoder 22; the decoder 22 itself, which selects one and only one address decode line D025, D17, D34, D6 based upon the value present on the address lines A0-A2; and three output bit lines B0-B2, tied low with pull-down resistors 24, that together output a data word (B0, B1, B2). Within the logic array 28, the address decode lines D025, D17, D34 and D6 are electrically connected to the output bit lines B0-B2 through a plurality of appropriately-positioned connecting devices 26 to implement the data set of Table 2. Because Table 2 is fully row collapsed, each address decode line D025, D17, D34, and D6 encodes, or stores, a uniquely-valued data word (B0, B1, B2), which are respectively (0, 0, 1), (0, 1, 0), (1, 1, 0) and (0, 1, 1). The design of the ROM 20 appears quite similar to that of the initial design 10, but because the ROM 20 has fewer address decode lines, the ROM 20 may occupy a smaller foot-print on the substrate.

Decoder 22 is designed to implement a mapping function indicated by the row collapsed data set. Consistent with Table 2, the decoder 22 selects address decode line D025 when the input address provided on address lines A0-A2 is zero, two or five. Similarly, the decoder 22 selects address decode line D17 when the input address is one or seven, selects D34 when the input address is three or four, and selects D6 when the input address is six. Decoder 22 is thus an N to X decoder, where X is less than $2^N$; specifically, decoder 22 is a 3 to 4 decoder, as required by Table 2, which maps each of $2^{N=3}$ possible addresses to one of the X=4 address decode lines. When an address is mapped to an address decode line, the presence of that address on the input address lines A0-A2 causes the decoder 22 to assert that address decode line, as previously explained.

Designing the decoder 22 based upon the row collapsed Table 2 is a routine task for one of ordinary skill in the art. For example, simply taking the prior art decoder 10 of FIG. 1 and performing a logical OR of D0, D2 and D5 yields the address decode line D025. Address decode lines D17 and D34 can be provided in a similar manner. However, this is a simplistic approach that may use more gates than are necessary to implement the decoder 22. Known optimization techniques exist to design the decoder 22 with a minimal number of gates. or devices.

One aspect of the invention is that the footprint of the logic array 28 is reduced, as fewer address decode lines are used. However, the decoder 22 may also be simplified by the row collapsed design, which may also lead to size reductions. For example, in the prior art, the decoder 12 selects address decode lines D0-D7 according to the following logic (where "!" is a logical "NOT" and "&" is a logical "AND"): D0=!A0 & !A1 & !A2; D1=A0 & !A1 & !A2; D2=!A0 & A1 & !A2 ... D6=!A1 & A2 & A3; D7=A1 & A2 & A3. Clearly, such a decoder 12 requires a large number of AND and NOT gates to be implemented, and in the prior art this complex decoder was used regardless of the contents of the data set. However, consider the situation in which the data set is highly redundant:

TABLE 3

| Address | Data word | | |
|---|---|---|---|
| (A2, A1, A0) | B0 | B1 | B2 |
| 0 (0, 0, 0) | 0 | 0 | 0 |
| 1 (0, 0, 1) | 0 | 0 | 0 |
| 2 (0, 1, 0) | 0 | 0 | 0 |
| 3 (0, 1, 1) | 0 | 0 | 0 |
| 4 (1, 0, 0) | 1 | 1 | 1 |
| 5 (1, 0, 1) | 1 | 1 | 1 |
| 6 (1, 1, 0) | 0 | 1 | 0 |
| 7 (1, 1, 1) | 0 | 1 | 0 |

When fully row collapsed, Table 3 above becomes:

TABLE 4

| Address | Data word | | |
|---|---|---|---|
| | B0 | B1 | B2 |
| 0, 1, 2, 3 | 0 | 0 | 0 |
| 4, 5 | 1 | 1 | 1 |
| 6, 7 | 0 | 1 | 0 |

Figure 3:
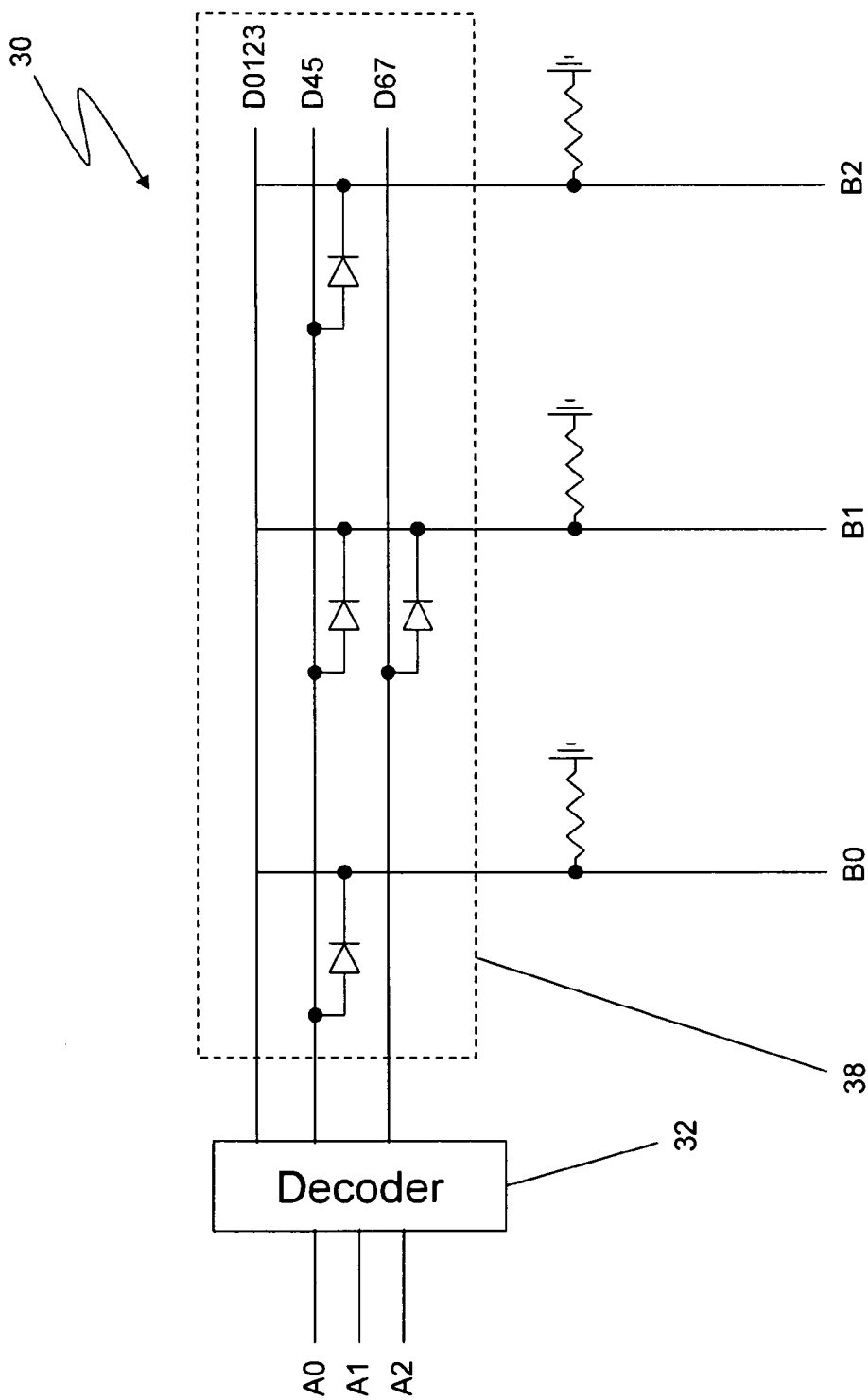
FIG. 3 is a circuit diagram of a second embodiment improved ROM.

An embodiment improved ROM 30 according to the instant invention, implementing the data set of Table 3, but utilizing the fully row collapsed Table 4, is shown in FIG. 3. The logic array 38 conforms to Table 4, having but three address decode lines D0123, D45 and D67, in which address decode line D0123 stores the data word (0, 0, 0), address decode line D45 stores the data word (1, 1, 1) and address decode line D67 stores the data word (0, 1, 0). Each address decode line thus stores a unique data word, which may be a zero or non-zero value. The logic required to implant the address decoder 32 is given by: D0123=!A2; D45=A2 & !A1; D67=A2 & A1.

The logic array 38 is clearly smaller than what would be provided by an equivalent array in the prior art, having three address decode lines instead of eight. Furthermore, the decoder 32 is also smaller, both because it has fewer address decode lines and because the underlying selection logic is considerably simpler, requiring just two AND gates and two NOT gates. Hence, the embodiment instant invention row collapsing method can provide ROMs that have not only a smaller size for the array logic encoding the data set, but also for the decoder that selects the appropriate address decode lines.

Another aspect of the present invention contemplates even further improvements of a ROM by selectively inverting the data on a bit output line if the number of connecting devices on that bit output line exceeds a threshold value. The threshold value may be X/2, where X is the number of address decode lines. The output value of the output bit line is similarly inverted to correct for the logically inverted data present on the bit output line.

Figure 4:
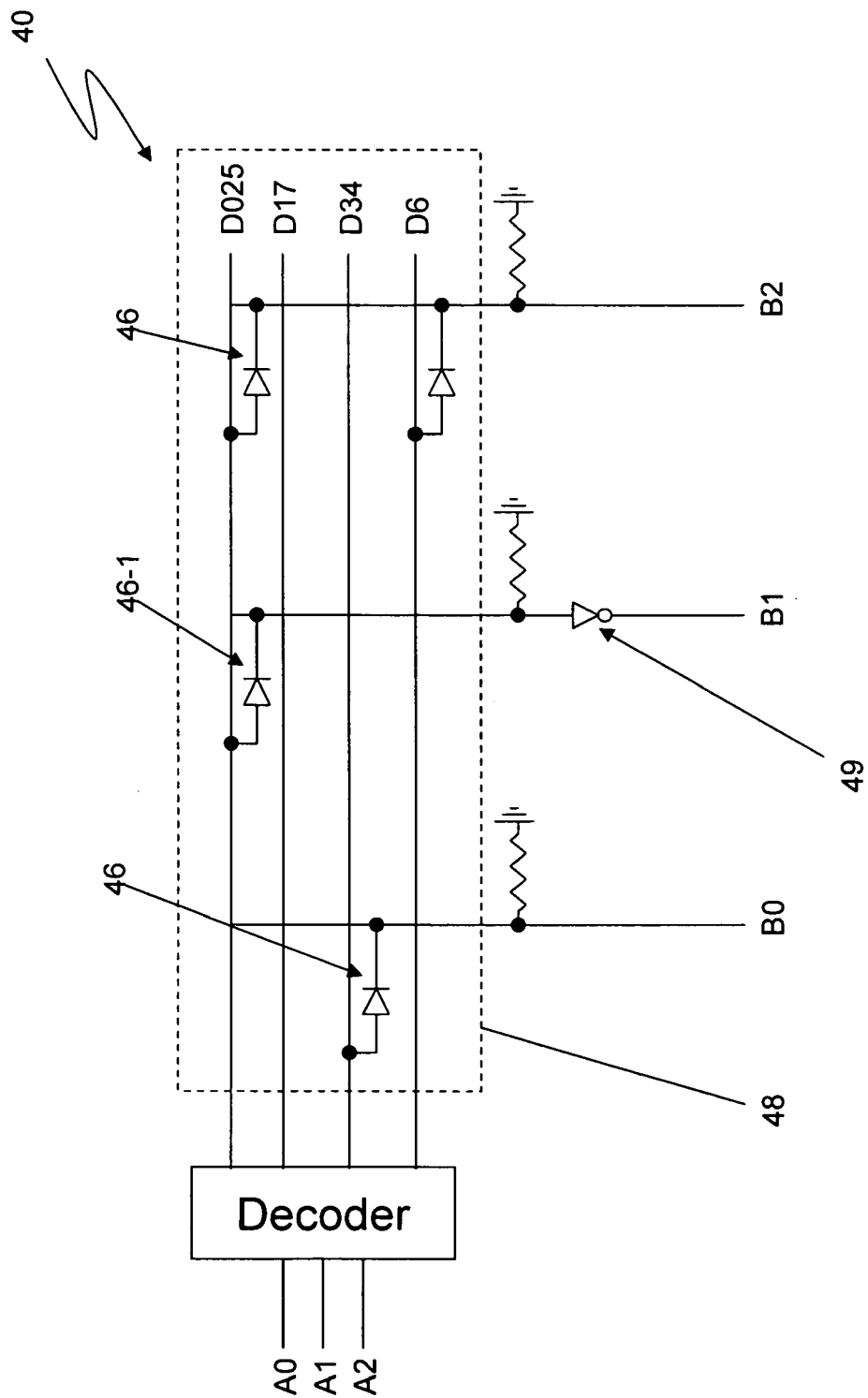
FIG. 4 is a circuit diagram of a third embodiment improved ROM.

By way of example, consider the improved ROM 20 of FIG. 2. The number of address decode lines is four, so X=4, and the threshold value of X/2 is thus two. The logic array 28 is, as indicated earlier, a hardware encoding of the data set present in Table 2, in which address decode lines D025, D17, D34 and D6 represent the rows in Table 2, output bit lines B0-B2 represent the columns of Table 2, connecting components 26 represent logical ones, and the lack of a connecting component 26 represents a logical zero. To further improve the ROM 20, each output bit line B0-B2 is considered in turn. If an output bit line B0-B2 has more than the threshold value of X/2, or two, connecting devices 26, an improvement procedure is performed that involves logically inverting the data set present on the output bit line, and logically inverting the output of the output bit line to present the correct output data bit. For example, output bit line B0 has but one connecting device 26, and so is left unchanged. Output bit line B2 has two connecting devices 26, which equals, but does not exceed, X/2, and so is also left unchanged. Output bit line B1, however, has three connecting devices 26-1, 26-2 and 26-3, and so may be improved. The resultant, further improved ROM 40 is depicted in FIG. 4. Output bit line B1 may be thought of as a column of data, represented by the presence or lack of connecting devices 26, which will be inverted. Initially, the ROM 20 has three connecting devices 26-1, 26-2 and 26-3 on output bit line B1 that respectively electrically connect output bit line B1 to address decode lines D17, D34 and D6, and no connecting device 26 connecting address decode line D025 to output bit line B1. A logical inversion of the data set present in the column represented by output bit line B1 is thus performed by removing these three connecting devices 26-1, 26-2 and 26-3, and inserting a new connecting device 46-1 that electrically connects address decode line D025 to output bit line B1, as shown in FIG. 4. The resultant modified logic array 48 represents a data set, as shown by Table 5 below, in which the column for data word B1 has been logically inverted from that of Table 2:

TABLE 5

| Address | Data word | | |
|---|---|---|---|
| | B0 | B1 | B2 |
| 0, 2, 5 | 0 | 1 | 1 |
| 1, 7 | 0 | 0 | 0 |
| 3, 4 | 1 | 0 | 0 |
| 6 | 0 | 0 | 1 |

To ensure that output bit line B1 implements the data set present in Table 2, and not that of Table 5, a logical inverter (NOT) 49 is inserted into output bit line B1, and it is the output of the NOT gate 49 that provides the final output for output bit line B1. A quick glance at the logic arrays 28 and 48 clearly shows that the logic array 48 of the further improved ROM 30 utilizes fewer connecting devices 46. By having fewer connecting devices 46 within the logic array 48, the improved ROM 40 may use less power than the ROMs 10, 20, and exhibit better capacitance characteristics.

Figure 5:
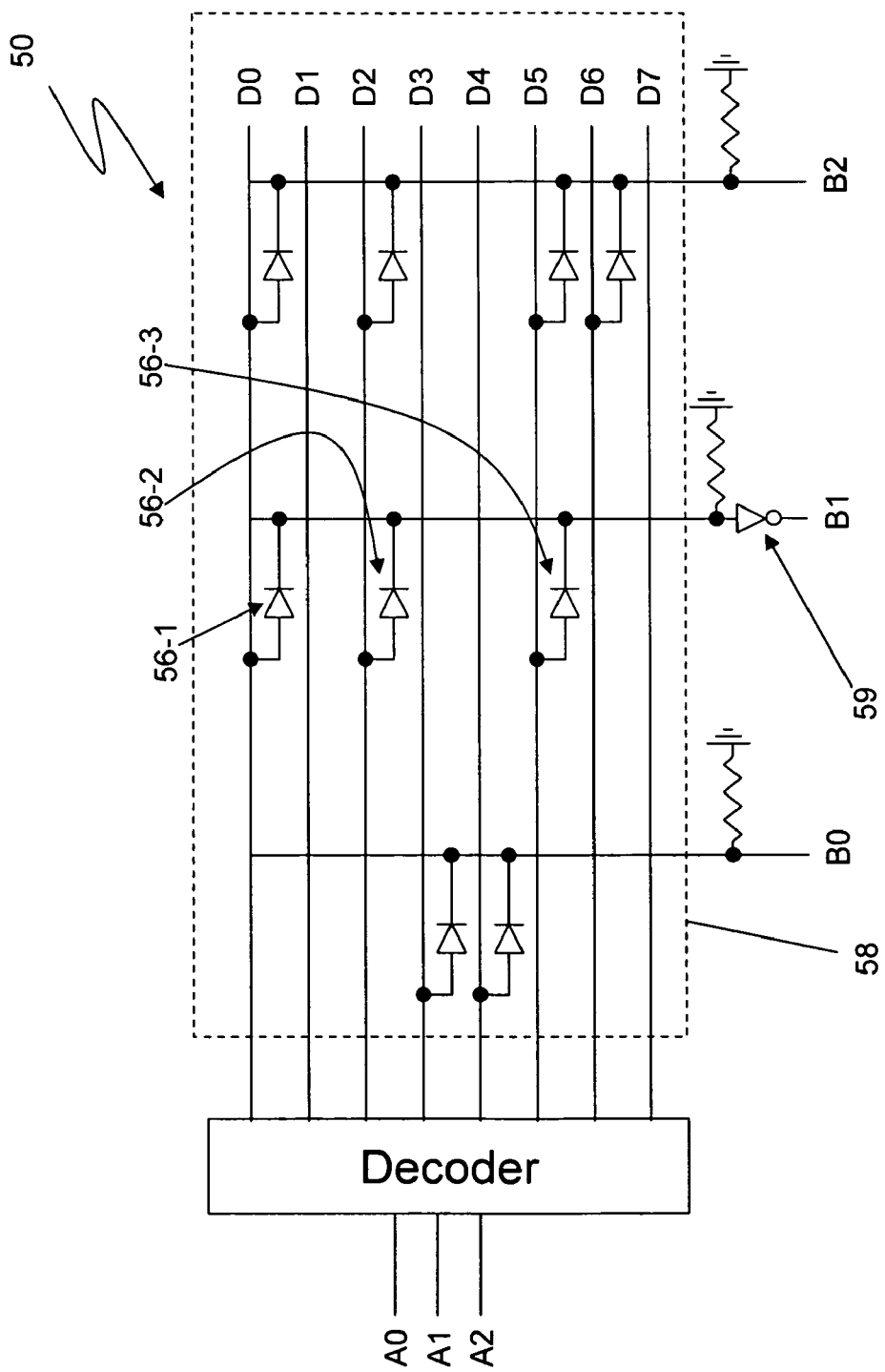
FIG. 5 is a circuit diagram of a fifth embodiment improved ROM.

The above-improvement technique is not limited to only ROMs that have been row-collapsed. On the contrary, any ROM may benefit from this data-inversion technique, and thereby offer improved power savings. FIG. 5, for example, shows a ROM 50 similar to the prior art ROM 10 of FIG. 1, but which has been improved by inverting output data bit B1 according to the above method, thereby reducing the number of connecting elements for output data bit B1 from five to three. Specifically, all five connecting devices 16 respectively connecting bit output line B1 to address decode lines D1, D3, D4, D6 and D7 of FIG. 1 are removed, and three new connecting devices 56-1, 56-2 and 56-3 are added to respectively electrically connect output bit line B1 only to address decode lines D0, D2 and D5. The data set stored in logic array 58 along bit output line B1 is thus a logical inversion of the desired data set of Table 1. Inverter 59 provides the output of bit line B1, thus restoring the output of bit line B1 to a value that is consistent with the data set of Table 1.

The improvement methods and related ROMs of the instant invention have been presented with respect to a highly simple 8×3 ROM for ease of description. One of ordinary skill in the art, however, should recognize that the invention is readily expandable to any N×M ROM; indeed, it is possible that ROMs of greater dimension are more likely to benefit from the instant invention than those of lesser dimensions. In particular, ROMs that have a data set that is particularly rich in the number of connecting devices that must be employed are likely to benefit from the second technique of data inversion, and ROMs that have a large address space of relatively small data words are likely to benefit from the first technique of row-collapsing. Also, it will be appreciated that if the pattern for any of two or more bit outputs is absolutely identical, then one can collapse them and have one column but still drive two output pins.

Figure 6:
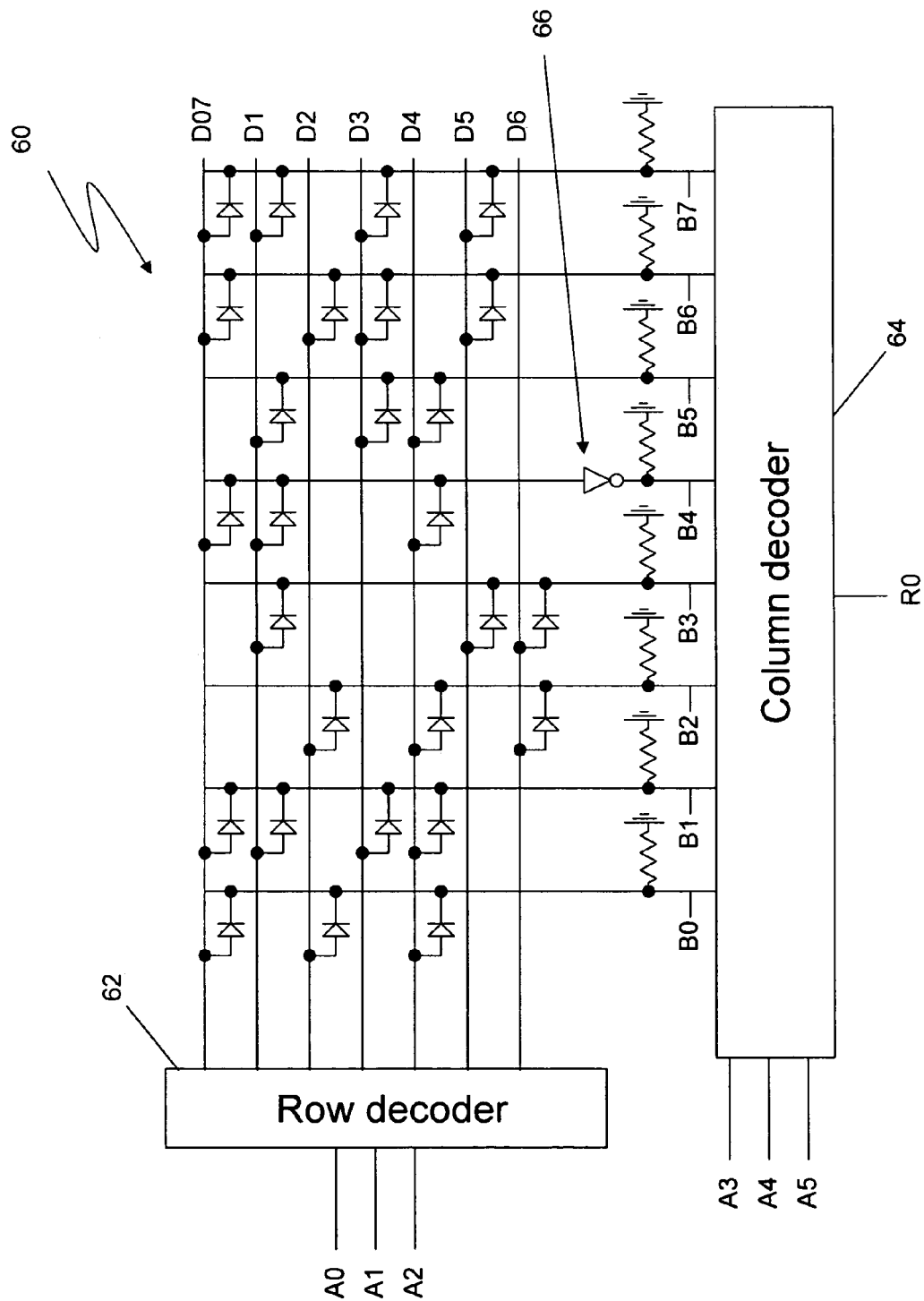
FIG. 6 is a circuit diagram of a sixth embodiment improved ROM that has a 2-D design.

For the sake of simplicity only, the above specific embodiments have shown ROM designs that utilize only one address decoder, as a row decoder for the word lines. It will be appreciated that the instant invention is equally applicable to 2-D ROM designs that utilize both row and column decoders. An example of such a design is depicted in FIG. 6, in which a, 2-D ROM design 60 has six address lines A0-A5, which are divided into three row lines A0-A2, and three column lines A3-A5. Column decoder 64 selects one of eight bit output lines B0-B7 for result output bit R0 based upon column address lines A3-A5. Row decoder 62 selects one of seven word lines D07, D1-D6 based upon row address lines A0-A2. Row address decode line D07 is selected by row address decoder 62 when the input row address lines A0-A2 assert row addresses of zero or seven. Additionally, bit output line B4 implements a logical inversion of the desired data set, and so the output of bit output line B4 is inverted by NOT gate 66 to provide a correct output data bit to the column decoder 64. Hence, although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the following claims.

What is claimed is:

1. A read-only memory (ROM) comprising:

an address decoder comprising N address input lines and X address decode lines, wherein $N \geq 2$ and $X < 2^N$, wherein for each $2^N$ addresses provided on the N address input lines the address decoder asserts a corresponding one of the X address decode lines; and a plurality of bit output lines electrically connected to the X address decode lines according to a data set to be stored in the ROM, wherein each of the X address decode lines stores a unique data word.

2. The ROM of claim 1 wherein a first hit output line of the plurality of bit output lines is electrically connected to the X address decode lines according to a logical inversion of the data set, an output of the first bit output line is connected to a logic inverter, the logic inverter providing a respective output data bit of the first bit output line.

3. A method of operating a read-only memory (ROM) comprising:

mapping $2^N$ addresses provided on N address input lines to X address decode lines, wherein $N \geq 2$ and $X < 2^N$;

combining duplicate data words of each of the $2^N$ addresses provided on the N address input lines; and storing, by each of the X address decode lines, a unique data word corresponding to at least one of the $2^N$ addresses.

* * * * *